(12) United States Patent
Barth

(10) Patent No.: US 8,598,718 B2
(45) Date of Patent: Dec. 3, 2013

(54) THREE-DIMENSIONAL MULTICHIP MODULE

(75) Inventor: Hans-Joachim Barth, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/587,835

(22) Filed: Aug. 16, 2012

(65) Prior Publication Data

US 2012/0313263 A1 Dec. 13, 2012

Related U.S. Application Data

(60) Division of application No. 13/157,586, filed on Jun. 10, 2011, now Pat. No. 8,247,910, which is a division of application No. 12/124,335, filed on May 21, 2008, now Pat. No. 7,986,033, which is a continuation of application No. PCT/EP2006/067882, filed on Oct. 27, 2006.

(30) Foreign Application Priority Data

Nov. 29, 2005 (DE) .......................... 10 2005 056 907

(51) Int. Cl.
*H01L 23/52* (2006.01)

(52) U.S. Cl.
USPC .... 257/777; 257/686; 257/723; 257/E23.141; 438/108; 438/109

(58) Field of Classification Search
USPC .................. 257/777, 737, 686, 723, E23.141; 438/108, 109

See application file for complete search history.

(56) References Cited

U.S. PATENT DOCUMENTS

| | | | |
|---|---|---|---|
| 4,843,542 A | | 6/1989 | Dashiell et al. |
| 5,426,563 A | * | 6/1995 | Moresco et al. ............. 361/689 |
| 5,708,298 A | | 1/1998 | Masayuki et al. |
| 5,760,478 A | | 6/1998 | Bozso et al. |
| 5,783,870 A | | 7/1998 | Mostafazadeh et al. |
| 5,977,640 A | | 11/1999 | Bertin et al. |
| 6,040,203 A | | 3/2000 | Bozso et al. |
| 6,075,287 A | | 6/2000 | Ingraham et al. |
| 6,433,413 B1 | | 8/2002 | Farrar |
| 6,472,746 B2 | * | 10/2002 | Taniguchi et al. ............ 257/723 |
| 7,190,068 B2 | | 3/2007 | Hackitt et al. |
| 2005/0173807 A1 | | 8/2005 | Zhu et al. |

FOREIGN PATENT DOCUMENTS

EP 0 827 203 A2 3/1998
WO WO 2006/012167 A1 2/2006

OTHER PUBLICATIONS

Pozder, S., et al., "Back-End Compatibility of Bonding and Thinning Porcesses for a Wafer-Level 3D Interconnect Technology Platform," Proceedings of the IEEE 2004 International Interconnect Technology Conference, Jun. 7-9, 2004, pp. 102-104.
"Assembly and Packaging: Technology Requirements," The International Technolgy Roadmap for Semiconductors: 2003, pp. 472-473.
Scott, M., "Upgrading and Repair PC," Sep. 2001, 13th edition, Que, pp. 131, 134, 185.

* cited by examiner

*Primary Examiner* — Thinh T Nguyen
(74) *Attorney, Agent, or Firm* — Slater & Matsil, L.L.P.

(57) ABSTRACT

A three-dimensional multichip module includes a first integrated circuit chip having at least one first high-temperature functional area and one first low-temperature functional area, and at least one second integrated circuit chip having a second high-temperature functional area and a second low-temperature functional area. The second high-temperature functional area is arranged opposite the first low-temperature functional area. As an alternative, at least one low-temperature chip having only one low-temperature functional area can also be arranged between the first and second chips.

19 Claims, 5 Drawing Sheets

THREE-DIMENSIONAL MULTICHIP MODULE

This is a divisional application of U.S. patent application Ser. No. 13/157,586, entitled "Three-Dimensional Multichip Module" which was filed on Jun. 10, 2011 and which is a divisional application of U.S. patent application Ser. No. 12/124,335, entitled "Three-Dimensional Multichip Module" which was filed on May 21, 2008 and which is a continuation of International Application No. PCT/EP2006/067882, filed Oct. 27, 2006, which designated the United States and was not published in English, and which is based on German Application No. 10 2005 056 907.2, filed Nov. 29, 2005, all of which applications are hereby incorporated herein by reference.

TECHNICAL FIELD

The present invention relates to a three-dimensional multichip module and in particular to a multiprocessor data processing unit having optimized heat distribution and improved electrical properties.

BACKGROUND

In semiconductor technology, integrated circuits are usually produced on a semiconductor wafer, in which case, after the completion of the integrated circuits in the wafer, the latter is separated into a plurality of individual chips or components. These "two-dimensional" chips are subsequently mounted, for example, onto a leadframe by means of a bonding method or a so-called "flip-chip" bump method and packaged in a housing.

However, the use of such "two-dimensional" chips has disadvantages including an increased space requirement, reduced yield, and undesirable high signal propagation times, capacitances and inductances. Therefore, so-called three-dimensional multichip modules are increasingly being produced, a plurality of such two-dimensional chips or components being stacked one above another and electrically (and mechanically) connected to one another.

Particularly when realizing multiprocessor data processing units having a plurality of interconnected processors or processor cores, however, significant problems arise in this case in the context of the heat distribution or heat dissipation. Therefore, particularly when producing multiprocessor data processing units, two-dimensional chips are still used on which two or more processor cores are situated in a manner distributed in the semiconductor component. In this case, however, the disadvantages of inadequate signal propagation times once again arise, which lead to particular problems at present-day clock rates.

SUMMARY OF THE INVENTION

In one aspect, the invention provides a three-dimensional multichip module having improved thermal properties and signal propagation times.

In one embodiment, a three-dimensional multichip module having a first integrated circuit chip and at least one further integrated circuit chip each having a high-temperature functional area and a low-temperature functional area can be constructed in such a way that at least one low-temperature chip having only one low-temperature functional area is arranged between the integrated circuit chips. In this way, undesirable focusing or concentration of heat at one location in the multichip module can be reliably prevented and the heat distribution can be made more uniform.

As an alternative, in the three-dimensional multichip module, the at least one further high-temperature functional area of the at least one further integrated circuit chip can be arranged opposite a first low-temperature functional area of the first integrated circuit chip, whereby a balanced heat distribution can again be achieved in the multichip module.

Preferably, the abovementioned alternatives can also be combined with one another, whereby a further improvement in the heat distribution in the multichip module can be realized.

Preferably, the integrated circuit chips are identical or constructed in identical fashion, the arrangement of their high-temperature functional areas being rotated by 90 degrees, 180 degrees, or 270 degrees, with respect to one another or else being mirrored with respect to an axis of symmetry of the chip, whereby the production costs for a multichip module with optimum heat distribution can be significantly reduced.

Preferably, a high-temperature functional element in the high-temperature functional area of a first chip is electrically connected to a low-temperature functional element in the low-temperature functional area of the further chip or of the low-temperature chip in such a way that a total wiring length over a plurality of chips is shortened relative to a wiring length within the same chip. In addition to the optimized heat distribution, it is also possible in this way to significantly reduce the signal propagation times and hence undesirable parasitic capacitances or inductances, which leads to improved electrical properties, that is to say to faster switching times through reduced signal delays (RC delays), of the overall circuit to be realized.

Preferably, the integrated circuit chips are microcontroller or microprocessor components whose high-temperature functional areas represent the processor cores and whose low-temperature functional areas represent their cache memories, registers and/or bus control units. In this way, it is possible to realize extremely powerful multiprocessor data processing units essentially using already existing microcontroller or microprocessor components. Therefore, the production costs are likewise significantly reduced.

In this case, the low-temperature chips inserted can be, in particular, cache memory components such as, e.g., SRAM memories, which have extremely low evolution of heat, but can now be driven with minimal signal propagation times. Other low-temperature functional areas or low-temperature chips can alternatively be embodied as DRAM memories, as EEPROM, flash memories (NAND flash, NOR flash, etc.) or as other nonvolatile memory (NVM, e.g. as FERAM, MRAM, etc.). Combinations of different memory types are also possible, both on one chip and on different chips.

For realizing the electrical connection between the respective chips it is possible to use not only face-to-face bonds but also through-Si via bonds or a combination of through-Si vias with micro-bumps.

As an alternative to the above-described microprocessors or microcontrollers, it is also possible to use power semiconductor components having regions with high evolution of heat as integrated circuit chips in multichip modules.

BRIEF DESCRIPTION OF THE DRAWINGS

The invention is described in more detail below on the basis of exemplary embodiments with reference to the drawings.

In the figures.

DETAILED DESCRIPTION OF ILLUSTRATIVE EMBODIMENTS

Figure 1:
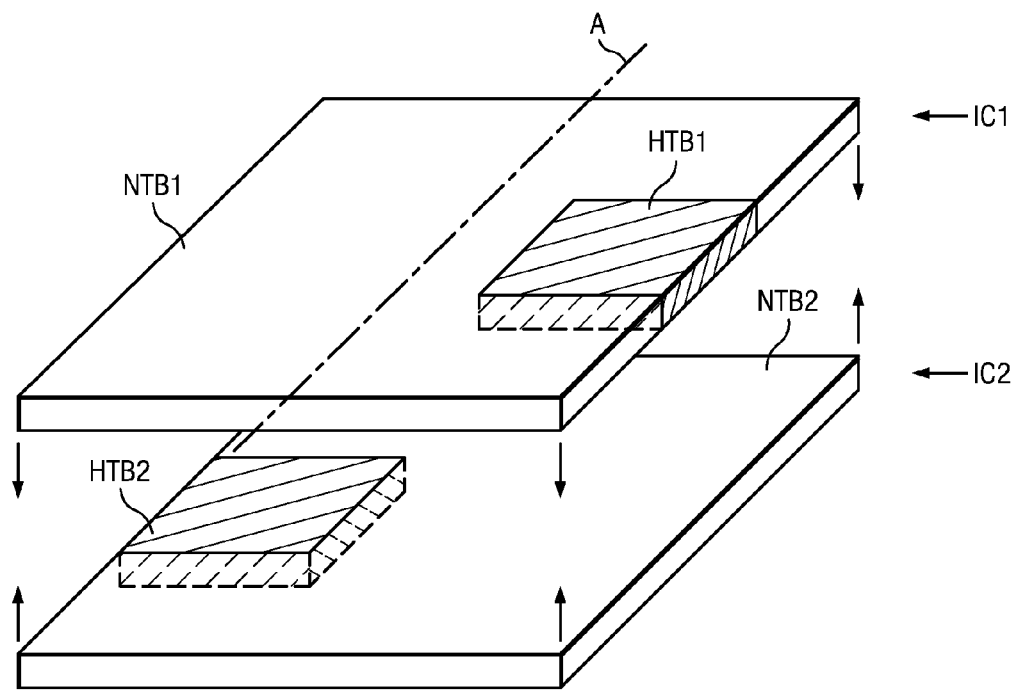
FIG. 1 shows a simplified perspective view of a multichip module in accordance with a first exemplary embodiment.

FIG. 1 shows a simplified perspective view of a three-dimensional multichip module in accordance with a first exemplary embodiment.

To put it more precisely, in accordance with FIG. 1, a first integrated circuit chip IC1 and a second integrated circuit chip IC2 are produced by means of conventional production methods. Each of the chips has at least one high-temperature functional area HTB1 and HTB2 with high emission of heat or evolution of heat. The remaining part of the integrated circuit chips IC1 and IC2 has only low emission of heat or evolution of heat, for which reason these areas are referred to as low-temperature functional areas NTB1 and NTB2.

For typical high-performance microprocessors, the average power densities nowadays are approximately 0.4-0.6 watt/mm$^2$ (ITRS Roadmap, 2003 Edition, page 472) with a rising trend in the future. Locally over the processor core, however, higher power densities of up to 3 watts/mm$^2$ or more can easily occur, whereas power densities that are less than 0.3 watt/mm$^2$ occur in the memory areas. Accordingly, high-temperature functional areas have power densities of greater than approximately 0.7 watt/mm$^2$ and low-temperature functional areas have power densities of less than 0.3 watt/mm$^2$.

Figure 4:
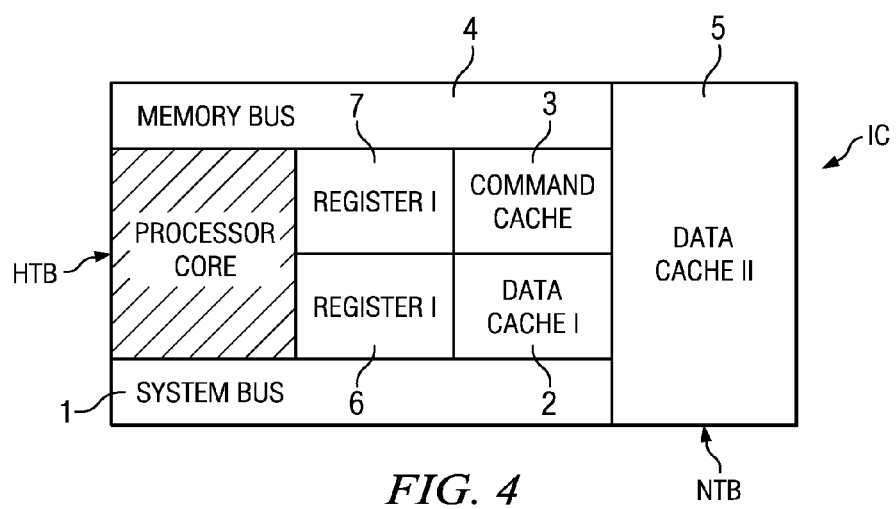
FIG. 4 shows a simplified plan view of a microprocessor component according to embodiments shown in FIGS. 1 to 3C.

By way of example, a microprocessor component IC in accordance with FIG. 4 can be used as integrated circuit chip. Microprocessor components of this type usually have a processor core or central processor unit (CPU) as high-temperature functional area HTB, which has high evolution of heat during operation. The remaining part of the microprocessor component IC is referred to as low-temperature functional area NTB on account of its low emission of heat and is used, e.g., for a system bus 1 and a memory bus 4, and also for data cache memory 2 and command cache memory 3, which are usually situated in direct proximity to the processor core or the high-temperature functional area HTB. Usually, a wide variety of register areas 6 and 7 are also arranged in this area near the processor. Furthermore, conventional microprocessor components IC of this type have a relatively large proportion of area for a data cache memory 5, which, as so-called L2 cache, has a plurality of transistors for realizing e.g. an SRAM memory. A temperature evolution in the units 1 to 7 and in particular of the data cache memory 5 of the low-temperature functional area NTB is usually very small.

In accordance with FIG. 1, a three-dimensional multichip module, which can preferably comprise two identical microprocessor components in accordance with FIG. 4, can now be realized in such a way that the integrated circuit chips IC1 and IC2 are arranged opposite one another with regard to their main surfaces and are both mechanically and electrically connected to one another. In this case, the at least one further high-temperature functional area HTB2 of the second integrated circuit chip IC2 is arranged directly opposite the first low-temperature functional area NTB1 of the first integrated circuit chip IC1. With such a realization of a three-dimensional multichip module comprising two integrated circuit chips, an improved heat distribution is obtained since the heat-generating high-temperature functional areas do not directly touch one another or are not arranged directly opposite one another but rather are shifted spatially with respect to one another.

An arrangement of this type is preferably realized by using the same or identical integrated circuit chips IC1 and IC2, which are mirrored with respect to their axis A of symmetry illustrated in FIG. 1. In this case, the axis A of symmetry is preferably at a maximum possible distance from the high-temperature functional area HTB1 and usually lies in the center of the integrated circuit chip.

Particularly in the case of wafer-to-wafer mounting, in which as yet undivided wafers are placed onto one another and connected to one another, such mirroring can be carried out very easily by means of two wafers provided with a plurality of integrated circuit chips being placed onto one another either by their rear sides or by their front sides and being contact-connected.

In order to realize a three-dimensional multichip module, the wafers thus fixed to one another only have to be electrically connected to one another by means of a face-to-face bond and/or a through-Si via bond method known to the person skilled in the art and/or a combination of a through-Si via method with micro-solder bumps.

In the case of the face-to-face bonds, the chip pads (metal pads) on adjacent chips are typically soldered to one another (e.g. at 300° C. under a protective gas atmosphere, two Cu pads can be soldered using Sn as solder, an electrically conductive and stable Cu$_3$Sn phase being formed, for example). In the case of the through-Si via bonds, the contacts or vias of one chip, which are filled with metal and lead through the Si substrate, are typically bonded with metallic chip pads (metal pads) of the adjacent chip. Suitable metals for via filling and for shaping the pads are, e.g., Cu, Ag, Au, Al, Ni, W, Co, Ti, Ta, or other readily conductive materials, metal alloys or combinations of different metals which can be reliably bonded together. Under certain circumstances, it can also be advantageous to use, instead of the metal-to-metal bond, microscopic solder balls (micro-solder bumps) for connecting the through-Si vias of one chip to the pads of the second chip. The micro-solder bumps typically have a size of from 5 μm to a few 100 μm and can be realized, for example, from Sn, SnPb, SnAg, SnAgCu, SnIn, SnBi, SnCu, In, BiPb, BiAg, BiCu, PbAg, PbCu or other metals or metal combinations having a low melting point.

Such electrical connections for three-dimensional multichip modules are generally known to the person skilled in the art and, moreover, for example, from the literature reference S. Pozder et al.: "Back-end compatibility of bonding and thinning processes for a wafer-level 3D interconnect technology platform", Proceedings of International Interconnect Technology Conference (IITC) 2004, pages 102 to 104. The wafer stacks thus fixed to one another can subsequently be divided or sawn apart in a customary manner, the desired three-dimensional multichip module thereby being obtained.

Although the costs for the three-dimensional multichip module can be greatly reduced by the above-described mirroring and processing at the wafer level, alternative production methods are also conceivable, in principle, in which, by way of example, an already singulated integrated circuit chip is applied to a wafer (die-to-wafer) or two singulated integrated circuit chips as illustrated in FIG. 1 are mirrored about the axis A of symmetry or stacked onto one another (die-to-die).

The last-mentioned production methods, in particular, i.e., die-to-die and die-to-wafer, furthermore enable alternative stack arrangements or three-dimensional multichip modules.

Figure 2:
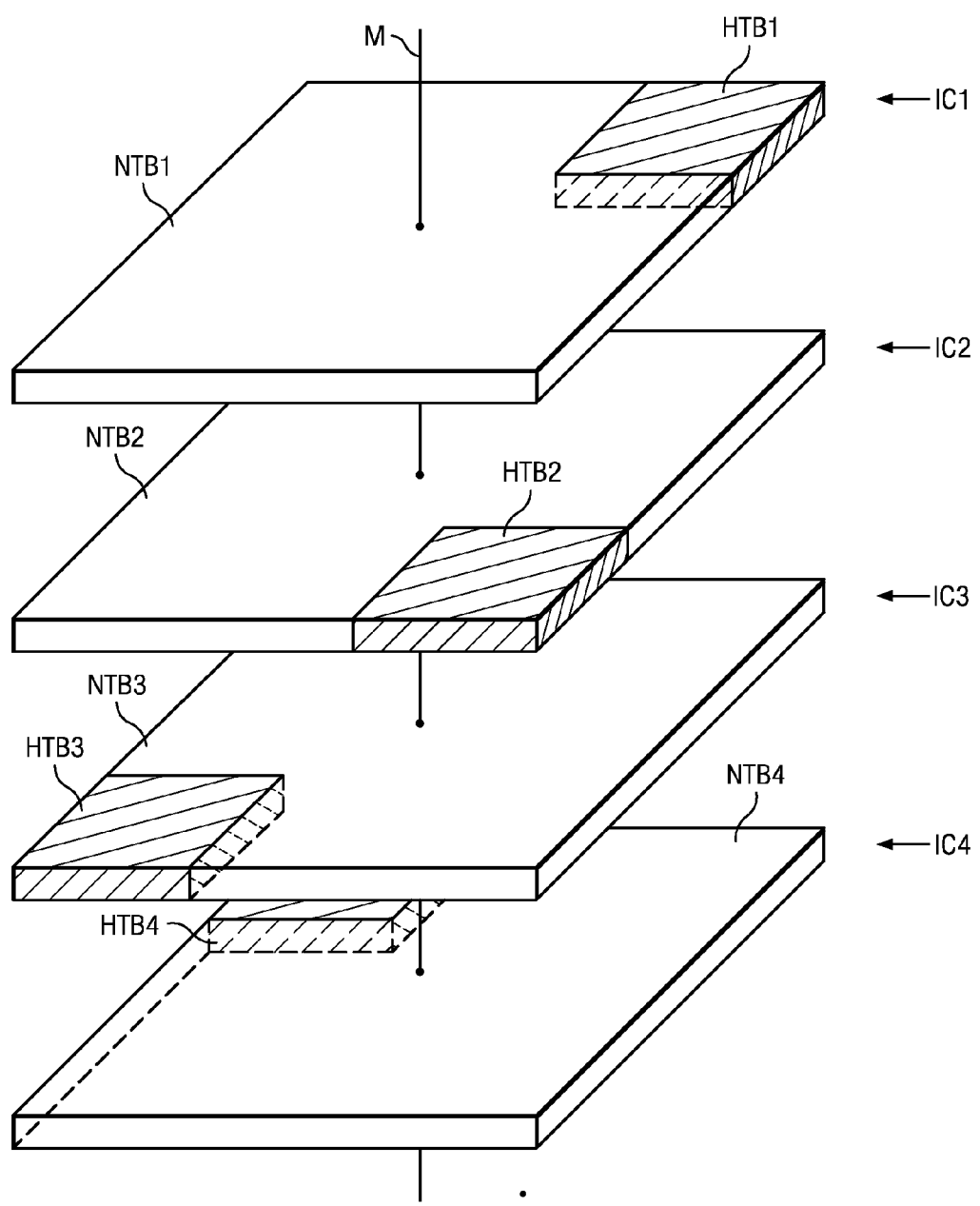
FIG. 2 shows a simplified perspective view of a multichip module in accordance with a second exemplary embodiment.

FIG. 2 shows a simplified perspective view of a three-dimensional multichip module in accordance with a second exemplary embodiment, identical reference symbols designating elements identical or corresponding to those in FIGS. 1 and 5, for which reason a repeated description is dispensed with below.

In accordance with FIG. 2, the three-dimensional multichip module now comprises four integrated circuit chips IC1 to IC4 each once again having a high-temperature functional area HTB1 to HTB4 and a low-temperature functional area NTB1 to NTB4.

In accordance with FIG. 2, an optimum heat distribution in the multichip module is achieved by virtue of the fact that the arrangement of the respective high-temperature functional areas HTB1 to HTB4 is rotated by 90 degrees, 180 degrees or 270 degrees with respect to one another. To put it more precisely, the second high-temperature functional area HTB2 can be arranged in a manner rotated by 90 degrees relative to the first high-temperature functional area HTB1 with respect to a common midpoint axis M. In the same way, the third high-temperature functional area HTB3 can be arranged in a manner rotated by 180 degrees, and the fourth high-temperature functional area HTB4 by 270 degrees, relative to the first high-temperature functional area HTB1, thus resulting in the desired optimum heat distribution in the three-dimensional multichip module. It goes without saying that the high-temperature functional areas can also be arranged in a manner rotated by 90, 180 or 270 degrees with respect to one another in a different way and/or be combined with a mirrored arrangement.

Once again, for mechanical and electrical connection, the materials and methods used in the abovementioned literature reference, in particular BCB (benzocyclobutene), are used as mechanical connecting means and face-to-face bonds and/or through-Si via bonds are used as electrical connections.

Figure 3A:
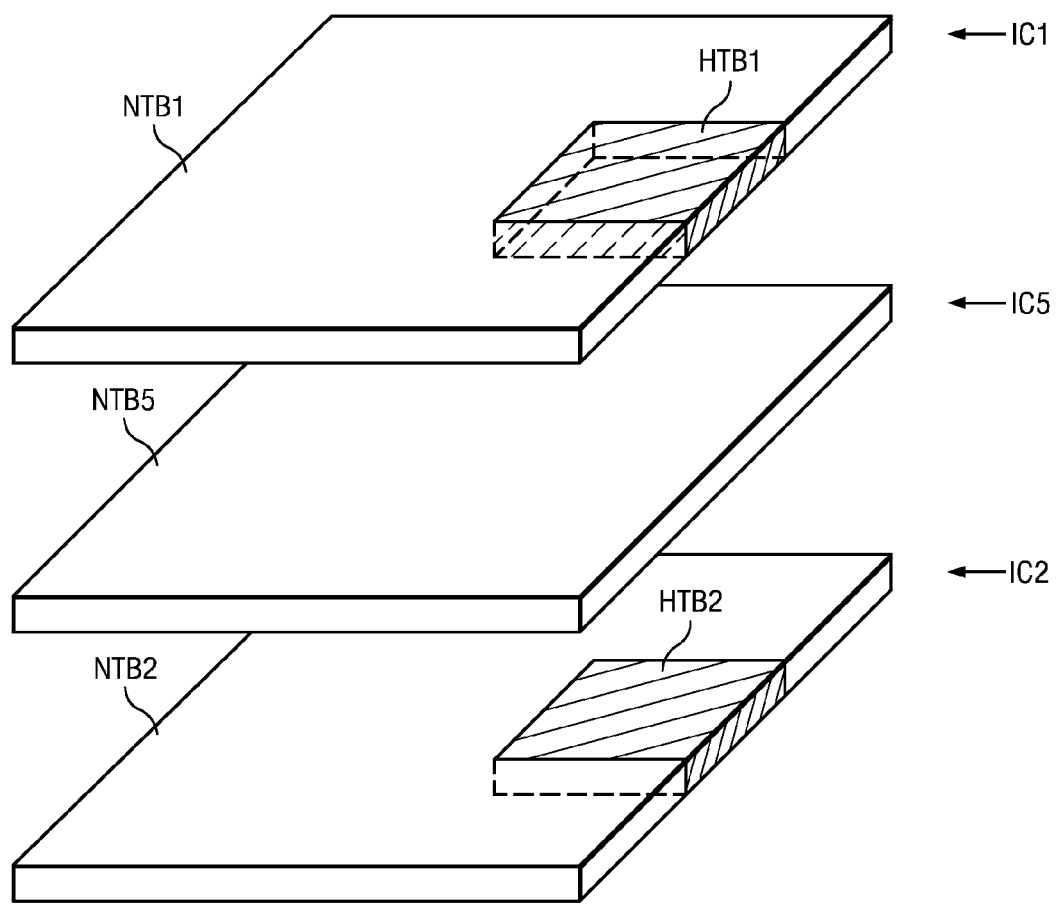
FIGS. 3A to 3C show simplified perspective views of a multichip module in accordance with third to fifth exemplary embodiments.

FIG. 3A shows a simplified perspective view of a three-dimensional multichip module in accordance with a third and fourth exemplary embodiment, identical reference symbols designating elements identical or corresponding to those in FIGS. 1 and 2, for which reason a repeated description is dispensed with below.

In accordance with the third exemplary embodiment according to FIG. 3A, the three-dimensional multichip module now comprises a first integrated circuit chip IC1, which once again has at least one first high-temperature functional area HTB1 with high emission of heat and one first low-temperature functional area NTB1 with low emission of heat, and at least one second integrated circuit chip IC2, likewise having a second high-temperature functional area HTB2 with high emission of heat and a second low-temperature functional area NTB2 with low emission of heat. The two chips IC1 and IC2 are once again arranged opposite one another with regard to their main surfaces and are mechanically and electrically connected to one another.

In order to realize an optimum heat distribution in the multichip module, however, in accordance with this third exemplary embodiment, no mirroring or rotation of the high-temperature functional areas HTB with respect to one another initially takes place, rather at least one low-temperature chip IC5 having only one low-temperature functional area NTB5 with low evolution of heat or emission of heat is arranged between the first integrated circuit chip IC1 and the second integrated circuit chip IC2.

Preferably, the low-temperature chip IC5 additionally inserted between the integrated circuit chips IC1 and IC2 is a so-called L2 cache memory and in particular an SRAM memory, if microprocessor components in accordance with FIG. 4 are used as integrated circuit chips IC1 and IC2. As an alternative, DRAM memories, EEPROM, flash memories (NAND flash, NOR flash, etc.) or other nonvolatile memories (NVM, e.g., as FERAM, MRAM, etc.) can be used as low-temperature functional areas or low-temperature chips. Combinations of different memory types are also possible, both on one chip and on different chips.

By inserting the low-temperature chip IC5 having only low-temperature functional areas NTB5 and therefore only low emission of heat, the heat distribution in the multichip module can once again be made more uniform, whereby heat dissipation of the multichip module can be simplified.

In this case, the heat dissipation is effected in a customary manner by means of active or passive cooling (i.e., heat sink, air cooling, liquid cooling, etc.).

Figure 3B:
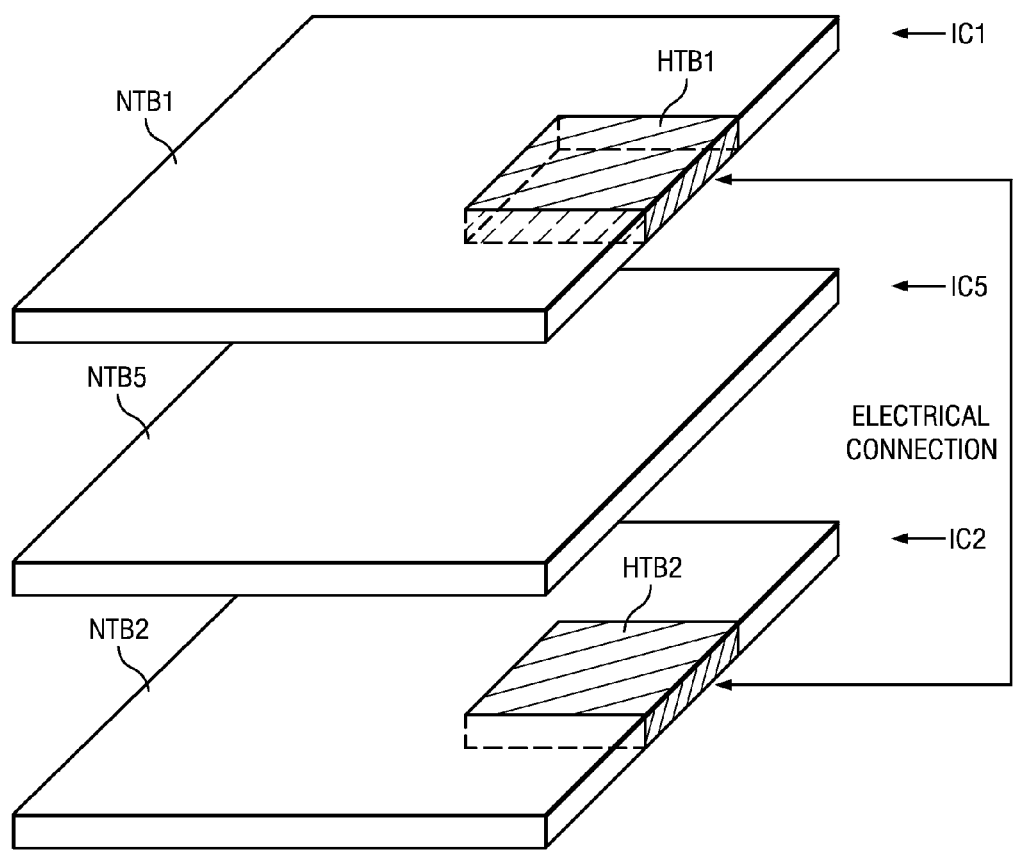
Figure 3C:
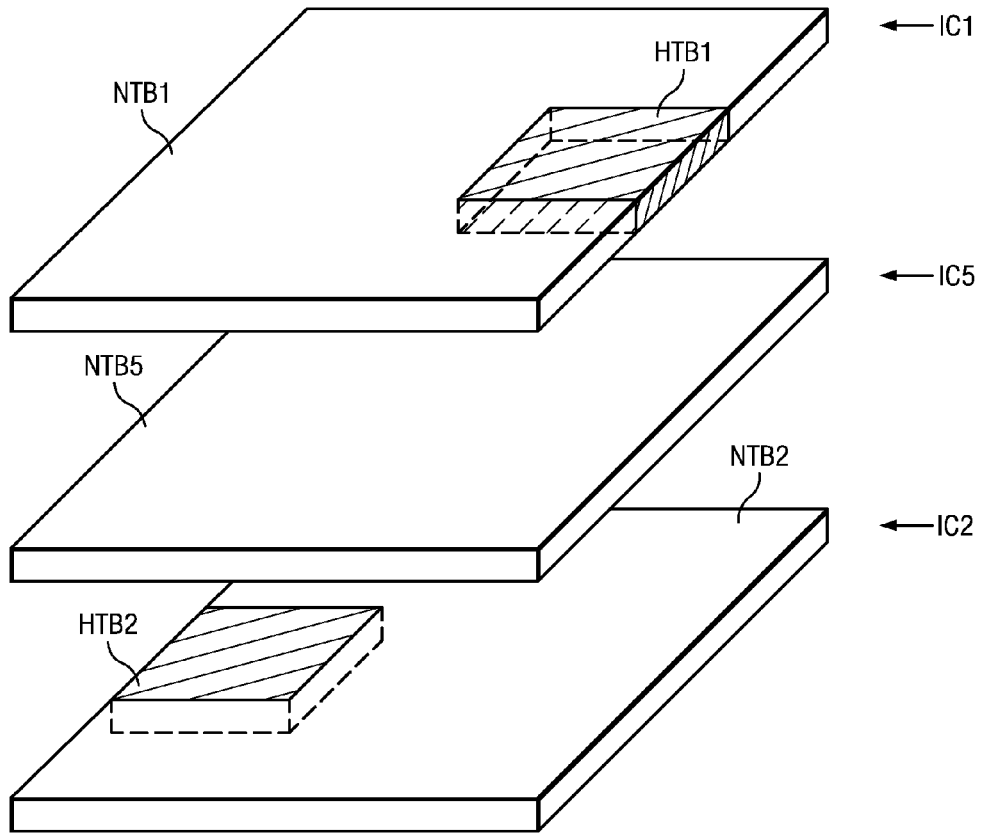

In accordance with a fourth exemplary embodiment according to FIG. 3B, the exemplary embodiments in accordance with FIGS. 1 to 3A can, of course, also be combined with one another, in which case, in addition to mirroring and/or rotation of the high-temperature functional areas, it is also possible to insert at least one low-temperature chip between two integrated circuit chips having high-temperature functional areas.

Although an outstanding heat distribution is already obtained in the three-dimensional multichip module in this way and hitherto unknown and powerful multichip circuits can thus be realized cost-effectively, a further advantage of the present invention consists in the particular electrical connection of high-temperature functional elements in the high-temperature functional areas to low-temperature functional elements in the low-temperature functional areas on another chip.

In accordance with another embodiment, a three-dimensional multichip module comprises a first integrated circuit chip IC1 and a second integrated circuit chip IC2, which are stacked one directly on top of another. In order to shorten signal propagation times and in order to reduce line capacitances and inductances, however, the wirings that are usually situated within a chip are now broken up and recreated. To put it more precisely, in one example, a high-temperature functional element in the high-temperature functional area HTB1 of the first chip IC1 is not wired to its customarily associated low-temperature functional element, but rather is connected to a chip-external low-temperature functional element lying in the second low-temperature functional area NTB2 on the second chip IC2.

This electrical connection is preferably realized only for the cases for which a total wiring length between the high-temperature functional element and the associated low-temperature functional element is shortened. This gives rise to novel functional units, which are now realized in chip-overarching fashion in a plurality of partial areas of the various chips. Both the signal propagation times and the parasitic capacitances and inductances can thereby be significantly reduced, whereby the electrical properties of an overall circuit are significantly improved.

In particular when using the same microprocessor components in accordance with FIG. 4 as mentioned in the introduction, the memory cells of the data cache memories 5 can therefore be assigned with significantly shortened wiring lengths to the adjoining processor cores, or processor cores situated in the vicinity, of other chips.

In this case, a total wiring length results as:

$$\sum_{n=1}^{m}(x_n + y_n + z_n),$$

where x, y, z denote a respective wiring length in the x, y and z direction of a respective chip and n=1 to m is used as an index of the respective chips ICn.

Such an electrical connection can once again also be carried out in the case of the exemplary embodiment in accordance with FIGS. 3A and 3B, preferably high-temperature functional elements being connected to low-temperature functional elements which are situated with the shortest possible spacing in the three-dimensional space. This can be realized in a simple manner particularly when the high-temperature areas HTB1, HTB2 of the chips IC1, IC2 are in each case rotated or mirrored with respect to one another, such that they adjoin different low-temperature areas of the chip 105 (FIG. 3B).

This results not only in a three-dimensional multichip module with improved heat distribution but also in a circuit to be realized thereby with improved electrical properties (in particular reduced signal propagation times and capacitances and inductances).

Although the invention has been described above on the basis of a microprocessor component in accordance with FIG. 4, it is in particular also applicable to microcontroller components having at least one controller core and generally to data processing components having one or more processor cores or controller cores as high-temperature functional areas and other memory areas as low-temperature functional areas.

Furthermore, the present invention is also applicable to power semiconductor components having areas with high evolution of heat which are used in particular in motor vehicle electronics.

What is claimed is:

1. A three-dimensional multichip module comprising:
   a first processor core in a first high-temperature functional area with high emission of heat in a first integrated circuit chip;
   a second processor core in a second high-temperature functional area with high emission of heat in a second integrated circuit chip;
   a third processor core in a third high-temperature functional area with high emission of heat in a third integrated circuit chip; and
   a fourth processor core in a fourth high-temperature functional area with high emission of heat in a fourth integrated circuit chip,
   wherein the first processor core is disposed in a first corner of the three-dimensional multichip module, wherein the second processor core is disposed in a second corner of the three-dimensional multichip module, wherein the third processor core is disposed in a third corner of the three-dimensional multichip module, and wherein the fourth processor core is disposed in a fourth corner of the three-dimensional multichip module.

2. The three-dimensional multichip module as claimed in claim 1, wherein the first integrated circuit chip comprises a first memory unit in a first low-temperature functional area with a low emission of heat, wherein the second integrated circuit chip comprises a second memory unit in a second low-temperature functional area with a low emission of heat, wherein the third integrated circuit chip comprises a third memory unit in a third low-temperature functional area with a low emission of heat, and wherein the fourth integrated circuit chip comprises a fourth memory unit in a fourth low-temperature functional area with a low emission of heat.

3. The three-dimensional multichip module as claimed in claim 1, wherein the first integrated circuit chip comprises bus control units in a first low-temperature functional area with a low emission of heat, wherein the second integrated circuit chip comprises bus control units in a second low-temperature functional area with a low emission of heat, wherein the third integrated circuit chip comprises third bus control units in a third low-temperature functional area with a low emission of heat, and wherein the fourth integrated circuit chip comprises fourth bus control units in a fourth low-temperature functional area with a low emission of heat.

4. The three-dimensional multichip module as claimed in claim 1, wherein the first to fourth integrated circuit chips are electrically connected by through via bonds.

5. The three-dimensional multichip module as claimed in claim 1, wherein at least two of the first to fourth integrated circuit chips are electrically connected by a face-to-face bond.

6. A three-dimensional multichip module comprising:
   a first processor core in a first high-temperature functional area with high emission of heat in a first integrated circuit chip; and
   a second processor core in a second high-temperature functional area with high emission of heat in a second integrated circuit chip,
   wherein the first processor core is disposed in a first corner of the three-dimensional multichip module, and wherein the second processor core is disposed in a second corner of the three-dimensional multichip module.

7. The three-dimensional multichip module as claimed in claim 6, wherein the first integrated circuit chip is identical to the second integrated circuit chip.

8. The three-dimensional multichip module as claimed in claim 6, wherein the first integrated circuit chip further comprises a first low-temperature functional area with a low emission of heat and wherein the second integrated circuit chip comprises a second low-temperature functional area with low emission of heat.

9. The three-dimensional multichip module as claimed in claim 8, wherein the first low-temperature functional area comprise a first memory unit and the second low-temperature functional area comprise a second memory unit.

10. The three-dimensional multichip module as claimed in claim 9, wherein the first memory unit and the second memory unit comprise SRAM units.

11. The three-dimensional multichip module as claimed in claim 9, wherein the first memory unit and the second memory unit comprise DRAM unit.

12. The three-dimensional multichip module as claimed in claim 9, wherein the first memory unit and the second memory unit comprise flash memory units.

13. The three-dimensional multichip module as claimed in claim 9, wherein a first total wiring length of a first electrical connection between the first processor core and the second memory unit is shorter than a second total wiring length of a second electrical connection between the first processor core and the first memory unit.

14. The three-dimensional multichip module as claimed in claim 6, wherein the first corner of the three-dimensional multi-chip and the second corner of the three-dimensional multi-chip are opposite corners.

15. The three-dimensional multichip module as claimed in claim 6, wherein at least one of the first integrated circuit chip and the second integrated circuit chip comprises a heat sink, air cooling or liquid cooling.

16. The three-dimensional multichip module as claimed in claim 6, wherein the first integrated circuit chip and the second integrated circuit chip are face-to-face bonded.

17. The three-dimensional multichip module as claimed in claim 6, wherein the first integrated circuit chip and the second integrated circuit chip are front side to back side bonded and connected via a through via.

18. A three-dimensional multichip module comprising:
   a first processor core in a first high-temperature functional area with high emission of heat in a first integrated circuit chip;
   a second processor core in a second high-temperature functional area with high emission of heat in a second integrated circuit chip; and
   a third processor core in a third high-temperature functional area with high emission of heat in a third integrated circuit chip,
   wherein the first processor core is disposed in a first corner of the three-dimensional multichip module, wherein the second processor core is disposed in a second corner of the three-dimensional multichip module, and wherein the third processor core is disposed in a third corner of the three-dimensional multichip module.

19. The three-dimensional multichip module as claimed in claim 18, wherein the first integrated circuit chip further comprises a first low-temperature functional area with a low emission of heat, wherein the second integrated circuit chip further comprises a second low-temperature functional area with low emission of heat and wherein the third integrated circuit chip further comprises a third low-temperature functional area with low emission of heat.

* * * * *